United States Patent

Tailor

[11] Patent Number: 6,127,895
[45] Date of Patent: Oct. 3, 2000

[54] CLOCK PULSE GENERATOR

[75] Inventor: Mahendra Tailor, Kenton, United Kingdom

[73] Assignee: Lucent Technologies Inc., Murray Hill, N.J.

[21] Appl. No.: 09/257,754

[22] Filed: Feb. 25, 1999

[30] Foreign Application Priority Data

Feb. 27, 1998 [EP] European Pat. Off. .............. 98301474

[51] Int. Cl.$^7$ ....................................................... H03L 7/18
[52] U.S. Cl. ........................... 331/1 A; 331/17; 327/159; 327/160; 375/376
[58] Field of Search ................................. 331/17, 14, 16; 375/376; 327/159, 160

[56] References Cited

U.S. PATENT DOCUMENTS

| | | | |
|---|---|---|---|
| 5,182,528 | 1/1993 | Zuta | 331/1 A |
| 5,459,435 | 10/1995 | Taki | 331/1 A |
| 5,668,503 | 9/1997 | Gersbach et al. | 331/1 A |

FOREIGN PATENT DOCUMENTS

| | | | |
|---|---|---|---|
| 86308364 | 10/1986 | European Pat. Off. | H03L 7/00 |
| 93115039 | 9/1993 | European Pat. Off. | H03L 7/099 |
| 2229332 | 3/1989 | United Kingdom | H03L 7/18 |

OTHER PUBLICATIONS

European Search Report dated Jul. 28, 1998.

*Primary Examiner*—Arnold Kinkead
*Attorney, Agent, or Firm*—Kenneth M. Brown

[57] ABSTRACT

A clock pulse generator which has a signal controlled oscillator for producing output clock pulses at a repetition rate determined by the value of a control signal. Control means is operative in a calibration cycle to set the control signal to a low or high value and record the clock pulses counted in a period of predetermined duration, to set the control signal to a high or low value and record the clock pulses counted in a period of said predetermined duration, and to calculate rate of change data representing the rate of change of recorded clock pulses with reference to change in the value of the control signal. The control means is operative in subsequent operational cycles to count reference pulses in a reference signal over a period of said predetermined duration, to count clock pulses in a period of said predetermined duration, to produce a difference signal representing a signed difference between the reference pulses counted and the clock pulses counted, and to adjust the value of the control signal by an amount calculated from the rate of change data to reduce any difference. The amount by which the control signal needs to be changed can be calculated to achieve an acceptable degree of synchronism in one step.

4 Claims, 1 Drawing Sheet

CLOCK PULSE GENERATOR

CROSS-REFERENCE TO RELATED APPLICATION

This application claims priority of European Patent Application No. 98301474.7, which was filed on Feb. 27, 1998.

FIELD OF THE INVENTION

This invention relates to clock pulse generators and in particular to the problem of synchronizing the output of a clock pulse generator with a reference pulse signal.

BACKGROUND OF THE INVENTION

It is frequently necessary to synchronize the output of a clock pulse generator with a reference pulse signal. In digital telecommunications, a local clock pulse generator may be required to run in synchronism with a reference pulse signal extracted from received signals. Known generators tend to overshoot and settle towards synchronism only after a number of oscillations. It is desirable to reduce the time it takes the generator to reach an acceptable degree of synchronism.

SUMMARY OF THE INVENTION

Against this background there is provided a clock pulse generator, comprising:
  a signal controlled oscillator for producing output clock pulses at a repetition rate determined by the value of a control signal; and
  a controller operative in a calibration cycle to set the control signal to a low value and record the clock pulses counted in a period of predetermined duration, to set the control signal to a high value and record the clock pulses counted in a period of said predetermined duration, and to calculate rate of change data representing the rate of change of recorded clock pulses with reference to change in the value of the control signal, and operative in subsequent operational cycles to count reference pulses in a reference signal over a period of said predetermined duration, to count clock pulses in a period of said predetermined duration, to produce a difference signal representing a signed difference between the reference pulses counted and the clock pulses counted, and to adjust the value of the control signal by an amount calculated from the rate of change data to reduce any difference.

In accordance with one illustrative embodiment of the present invention, the amount by which the control signal needs to be changed can be calculated to achieve an acceptable degree of synchronism in one step.

In the calibration cycle, the control means preferably monitors change in the clock pulses counted in successive periods after said low and/or high value is set, and records the time it takes for the change to settle to less than a predetermined value, and repeats an operational cycle only after said time has expired. This advantageously avoids further adjustments being made before the first has had effect. If the operational cycle were repeated earlier, a further unnecessary adjustment would be made which would cause an overshoot.

In an example wherein the control signal is digital, the amount of adjustment to the control signal is preferably calculated to reduce any difference to an amount corresponding to less than one unit in the digital signal. In that example, the signal controlled oscillator may include a digital to analog converter, an analog sample and hold circuit responsive to the analog output of the converter, and a voltage controlled oscillator responsive to the output of the sample and hold circuit.

BRIEF DESCRIPTION OF THE DRAWINGS

A preferred embodiment of the invention will now be described, by way of example, with reference to the accompanying drawings, in which.

DETAILED DESCRIPTION

Figure 1:
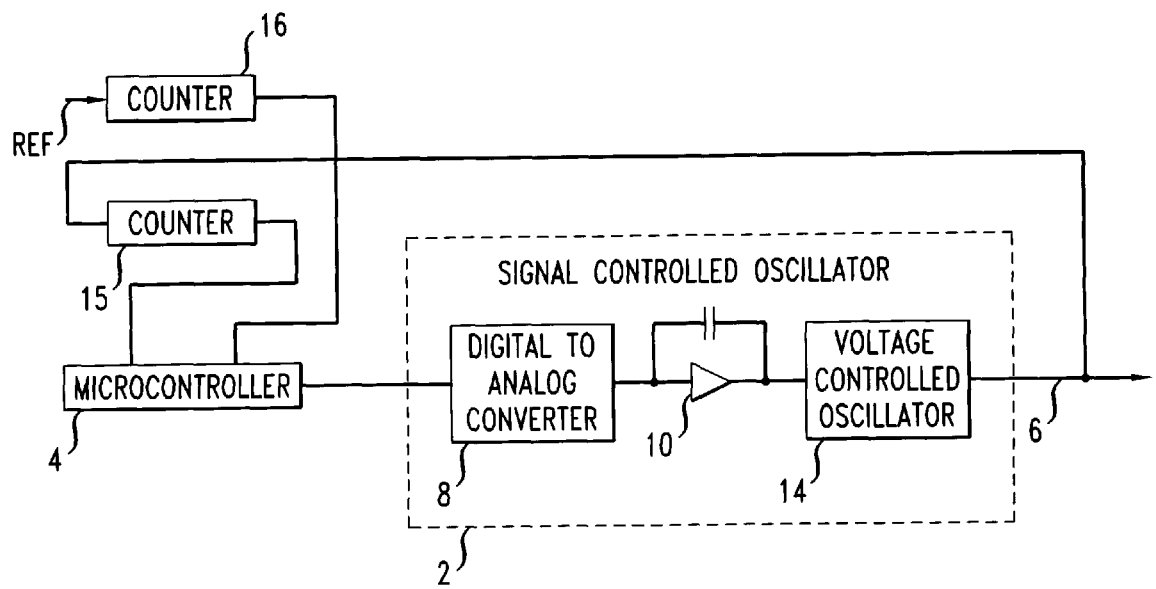
FIG. 1 is a block diagram of a pulse generator embodying the invention.
Figure 2:
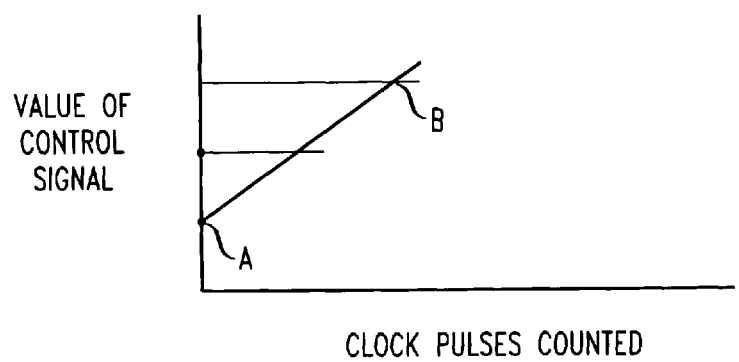
FIG. 2 is a graph showing control signal plotted against clock pulses counted in the calibration cycle of the generator of FIG. 1.

Referring to the drawings, a signal controlled oscillator 2 receives a binary control signal from a microcontroller 4. The oscillator 2 produces a clock pulse signal at its output 6 in which the pulse repetition rate is controlled by the value of the binary input signal.

The signal controlled oscillator 2 includes a digital to analog converter 8 which converts the binary signal from the microcontroller 4 to an analog signal. The analog signal is fed to the input of a sample and hold circuit the output of which is, in turn, fed to the control input 12 of a voltage controlled oscillator 14.

The clock pulse signal is fed to the input of a counter 15. An input reference pulse signal is fed to the input of a counter 16.

In a calibration cycle, the microcontroller sets the control signal to a low value A. The counter 15 counts clock pulses generated by the oscillator 2 in a period of the predetermined duration. The microcontroller records the number of pulses counted. Before or subsequent to that, the microcontroller sets the control signal to a high value B. The counter 14 counts clock pulses generated by the oscillator 2 in a period of the predetermined duration. The microcontroller again records the number of pulses counted.

The counts are repeated until they have settled, for example not changing by more than a predetermined amount between successive counts and the time T taken to settle is recorded.

The microcontroller 4 then calculates the rate R of change of counted pulses per unit change in the control signal:

$$R = \frac{Ph - Pl}{Bh - Bl}$$

where
  Bl is the value of the binary control signal when set low
  Bh is the value of the binary control signal when set high
  Pl is the number of clock pulses counted for Bl and
  Ph is the number of clock pulses counted for Bh.

In an alternative embodiment of the present invention, 1/R is calculated.

In subsequent operational cycles, both the counters 15 and 16 count the pulses arriving on their inputs in a period of predetermined duration in each operational cycle. A binary signal representing the counted pulses is fed from each counter to the microcontroller which subtracts one from the other to obtain a signed difference. The microcontroller then divides the difference by R (or equivalently multiplies by 1/R) to obtain a signed integer adjustment to the value of the control signal. The adjustment is added algebraically to the previous control signal.

The microcontroller then waits for a recorded time T to settle. Once that has passed the operational cycle is repeated.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. Thus, for example, it will be appreciated by those skilled in the art that the block diagrams herein represent conceptual views of illustrative circuitry embodying the principles of the invention.

The functions of the various elements shown in FIG. 1 may be provided through the use of dedicated hardware as well as hardware capable of executing software in association with appropriate software, such as, for example, a "processor." When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

I claim:
1. A clock pulse generator, comprising:
   a signal controlled oscillator for producing output clock pulses at a repetition rate determined by the value of a control signal; and
   a controller operative in a calibration cycle to set the control signal to a low value and record the clock pulses counted in a period of predetermined duration, to set the control signal to a high value and record the clock pulses counted in a period of said predetermined duration, and to calculate rate of change data representing the rate of change of recorded clock pulses with reference to change in the value of the control signal,
   and operative in subsequent operational cycles to count reference pulses in a reference signal over a period of said predetermined duration, to count clock pulses in a period of said predetermined duration, to produce a difference signal representing a signed difference between the reference pulses counted and the clock pulses counted, and to adjust the value of the control signal by an amount calculated from the rate of change data to reduce any difference,
   wherein the control signal is digital and wherein the amount of adjustment to the control signal is calculated to reduce any difference to an amount corresponding to less than one unit in the digital signal.

2. A clock pulse generator as claimed in claim 1, wherein in the calibration cycle, the controller monitors change in the clock pulses counted in successive periods after said low and/or high value is set, and records the time it takes for the change to settle to less than a predetermined value, and repeats an operational cycle only after said time has expired.

3. A clock pulse generator as claimed in claim 1, wherein the signal controlled oscillator includes a digital to analog converter, an analog sample and hold circuit responsive to the analog output of the converter, and a voltage controlled oscillator responsive to the output of the sample and hold circuit.

4. A clock pulse generator as claimed in claim 2, wherein the signal controlled oscillator includes a digital to analog converter, an analog sample and hold circuit responsive to the analog output of the converter, and a voltage controlled oscillator responsive to the output of the sample and hold circuit.

* * * * *